United States Patent [19]

Schober

[11] Patent Number: 4,823,073

[45] Date of Patent: Apr. 18, 1989

[54] SENSOR FOR MEASURING THE CURRENT OR VOLTAGE OF ELECTRICALLY CONDUCTIVE LAYERS PRESENT ON A REFERENCE SUBSTRATE

[75] Inventor: Konrad Schober, Munich, Fed. Rep. of Germany

[73] Assignee: Siemens Aktiengesellschaft, Berlin and Munich, Fed. Rep. of Germany

[21] Appl. No.: 171,446

[22] Filed: Mar. 21, 1988

[30] Foreign Application Priority Data

Mar. 31, 1987 [DE] Fed. Rep. of Germany ....... 3710596

[51] Int. Cl.$^4$ .................................... G01R 27/02
[52] U.S. Cl. .................................. 324/62; 204/1 T
[58] Field of Search .............. 324/439, 65 R, 62; 204/434, 1 T; 156/626, 627

[56] References Cited

U.S. PATENT DOCUMENTS

| | | | |
|---|---|---|---|
| 3,197,698 | 7/1965 | Schaschl | 324/65 R |
| 4,100,486 | 7/1978 | Casowitz et al. | 324/62 |
| 4,313,087 | 1/1982 | Weitzen | 324/65 R |
| 4,335,350 | 6/1982 | Chen | 324/62 |
| 4,543,576 | 9/1985 | Hieber et al. | 340/870.17 |
| 4,739,258 | 4/1988 | Schwarz | 324/65 R |

Primary Examiner—Reinhard J. Eisenzopf
Assistant Examiner—Maura K. Regan
Attorney, Agent, or Firm—Hill, Van Santen, Steadman & Simpson

[57] ABSTRACT

A sensor for measuring electrical properties of a coating on a reference substrate including a substrate holder for supporting the reference substrate, at least two electrical interconnects on the reference substrate, carrier laminae supported on the reference substrate, measuring laminae supported on the reference substrate for contact with the interconnects, the measuring laminae being isolated from each other, and contact elements extending from the substrate holder and engaging the measuring laminae.

8 Claims, 2 Drawing Sheets

SENSOR FOR MEASURING THE CURRENT OR VOLTAGE OF ELECTRICALLY CONDUCTIVE LAYERS PRESENT ON A REFERENCE SUBSTRATE

BACKGROUND OF THE INVENTION

1. Field of the Invention

The invention is directed to a sensor for measuring electrical properties of a coating which is deposited on or eroded from a reference substrate to identify the resistance or the temperature of the reference substrate.

2. Description of the Prior Art

The limits of tolerance of specific properties such as, for example, layer thicknesses or sheet resistances of electrically conductive layers on semiconductor substrates are becoming narrower and narrower in the manufacture of thin film circuits and integrated semiconductor circuits. When, for example, such layers are composed of alloys that are manufactured by simultaneous vapor deposition or sputtering of two or more different targets, an exact knowledge of the composition of the layers and, consequently, an exact monitoring of the layer generating process become of utmost importance.

In chromium-nickel thin film resistors, the temperature coefficient of the electrical resistance must lie in the range of $-25$ to $+25$ times $10^{-6}/K$ Since this value is dependent on the composition, the composition must not deviate by more than plus or minus 3% atomic parts in the concentration of a constituent.

In the case of tantalum silicide layers which are utilized in very large scale integrated technology as a low resistance gate or as interconnect materials, the electrical resistivity i.e., the dependency of the resistance on the thickness of the layer, is also greatly influenced by the composition. Moreover, only layers with a very specific composition can form an $SiO_2$ protective layer by oxidation of the silicon in an oxidizing atmosphere at temperatures of about 900° C. Here, also, the oxide growth can only be reproduced when the concentration of a constituent in the tantalum silicide layer fluctuates only slightly about a fixed value, the deviation being a maximum of plus or minus 2 atomic percent.

An in situ identification of a relevant measured value, for example, the electrical resistance, during the production of the layers is desirable for exact supervision of the composition of a layer. Added thereto as a complicating factor is that the substrates to be coated must be moved during the coating in order to achieve uniform layers, for example, as by rotation or by planetary movement.

German Pat. No. 31 23 427, corresponding to U.S. Pat. No. 4,543,576, issued Sept. 24, 1985 and incorporated herein by reference, discloses an arrangement which is capable of measuring the electrical resistance and the temperature of a reference substrate introduced into an evacuated chamber of a coating system. A specimen having a defined geometry is applied to an independent measuring unit in the form of a double pallet. The resistance measured according to the 2-point or 4-point method is transferred to the outside as a digital signal by an electronic means in a pulse-code modulation by means of a transmitter. The electronic means, the transmitter, and an independent power supply, for example, a battery, are arranged in insulated fashion in the inside of the double pallet.

The described apparatus, however, has the disadvantage that the measuring unit has considerably larger dimensions than a wafer or substrate which, typically, has a height of 0.6 mm whereas the height of the measuring unit equals, for example, 15 mm. This consequently requires an enlargement of the load lock of the coating or etching system that is rigidly dimensioned in terms of its dimensions. Moreover, the measuring equipment does not have great resistance to temperature and can no longer be used for coating processes at temperatures above 90° C.

SUMMARY OF THE INVENTION

The present invention provides a sensor of the type described which avoids the existing disadvantages. This sensor includes a substrate holder for supporting the reference substrate, at least two electrical interconnects on the reference substrate, carrier laminae supported on the reference substrate, measuring laminae supported on the reference substrate for contact with the interconnects, the measuring laminae not contacting the same interconnects having no contact with each other, and contact elements which extend from the substrate holder and engage the measuring laminae, the measuring laminae being free of contact to the substrate holder other than in the region of the contact elements.

It is advantageous to have the contact elements connected to a measuring arrangement that is arranged in the substrate holder or at the substrate holder. Thus, the measuring arrangement is not exposed to the temperature which acts on the substrate. The result is that the sensor with its measuring arrangement can be utilized at higher temperatures, for example, up to 500° C. which is considerably higher than the operating temperatures for known measuring arrangements.

The measuring laminae and the carrier laminae can be composed of two plates separated by a spacing lamina, one plate including an inwardly projecting projection. The laminae are slipped onto the reference substrate and are positioned at the reference substrate with the assistance of the projection. When the projection is arranged on the sheet of the carrier laminae that faces away from the substrate holder when the carrier laminae is put in position and the reference substrate is arranged on the substrate holder, then undesirable contact bridges by means of the contact laminae are prevented from rising in the coating of the reference substrate.

Further, the plate of the carrier laminae that lies on the substrate holder when the reference substrate is seated can be made thicker than the remaining plates of the carrier laminae and of the measuring laminae. The thicker plate then defines the distance of the sensor from the substrate holder and thus prevents the measuring laminae from lying on the substrate holder.

BRIEF DESCRIPTION OF THE DRAWINGS

The present invention will be set forth in greater detail with reference to an exemplary embodiment shown in the figures. In the figures.

DESCRIPTION OF THE PREFERRED EMBODIMENTS

Figure 1:
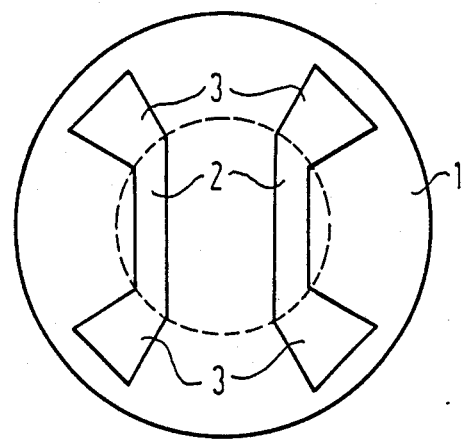
FIG. 1 is a plan view of a reference substrate.

FIG. 1 illustrates a reference substrate 1 which, for example, has the same dimensions as the other substrates that are to be coated in a coating system. A pair of interconnects 2 and 3 are arranged on the reference substrate 1 and, for example, comprise a strip shaped part 2 and contact regions 3. Two interconnects are shown in the drawing of FIG. 1 but, of course, more than two interconnects can also be present. When the reference substrate 1 is to be used for temperature measurement, then a thermocouple can be provided in insulated fashion in the region between the interconnects 2. Such a thermal element is not shown in FIG. 1.

Figure 2:
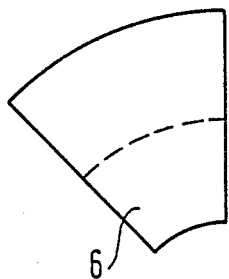
FIG. 2 is a plan view of carrier laminae.
Figure 3:
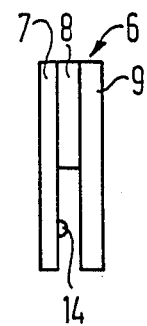
FIG. 3 is a side view of the carrier laminae of FIG. 2.

Before the reference substrate 1 is introduced into the coating system, measuring laminae 10 and carrier laminae 6 are applied to it. The structure of the carrier laminae is shown in FIGS. 2 and 3. They are composed of plates 7 and 9 that are separated by a spacing laminae 8. The plate 7 is provided with a projection 14 at its side which is directed toward the inside. When the carrier laminae 6 are inserted onto the reference substrate 1, the projection 14 has a locking function. It is desirable that the plate 9 be made thicker than the plate 7. For example, the plate 9 can be 0.5 mm thick and the plate 7 about 0.3 mm thick. This has the advantage that the distance of the reference substrate 1 and the laminae 6 and 10 from the substrate holder 16 is defined.

Figure 4:
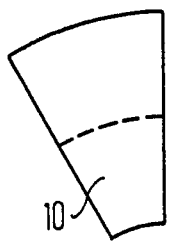
FIG. 4 is a plan view of measuring laminae.
Figure 5:
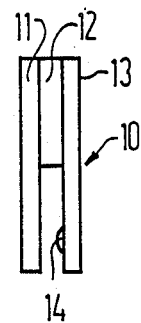
FIG. 5 is a side view of the measuring laminae of FIG. 4.

The structure of the measuring laminae 10 is shown in FIGS. 4 and 5. The plates 11 and 13 are separated by a spacing laminae 12. The thickness of the two plates 11 and 13 is the same and, for example, is at about 0.3 mm. There is also an inwardly extending projection 14 on one of the plates, namely the plate 13. This projection serves the purpose of frictionally engaging the measuring laminae 10 to the reference substrate 1. Since both plates 11 and 13 are of the same thickness in the case of the measuring laminae 10 and are also thinner than the plate 9 of the carrier laminae 6, the plate 9 of the carrier laminae prevents the measuring laminae 10 from lying against the substrate holder 16 when the laminae are secured.

Figure 6:
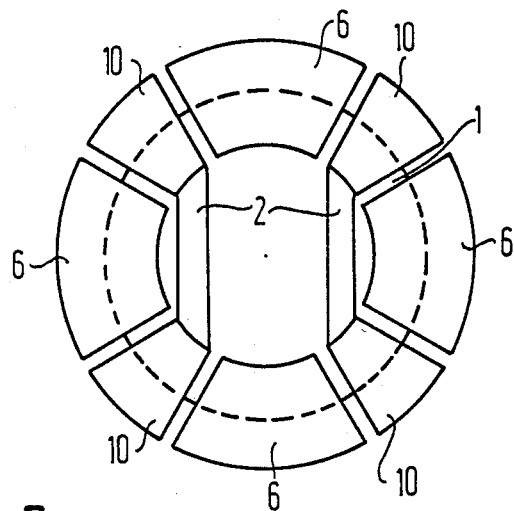
FIG. 6 illustrates a reference substrate with attached carrier laminae and measuring laminae.

FIG. 6 shows a reference substrate 1 comprising a clamped on carrier laminae 6 and measuring laminae 10. The measuring laminae 10 are releasably engaged with the contact region 3 of the interconnects 2, 3 on the reference substrate 1. The carrier laminae 6 are engaged with the reference substrate 1 between the measuring laminae 10. The distribution of the carrier laminae 6 must be such that the reference substrate with laminae uniformly lies on the substrate holder 16 and thus, a tilting of the reference substrate 1 is not possible. The plurality of measuring laminae 10 is determined by the plurality of contact regions 3 that are to be used as measuring points. The plurality of carrier laminae 6 is selected such that a reliable seating of the reference substrate 1 on the substrate 16 is provided.

Figure 7:
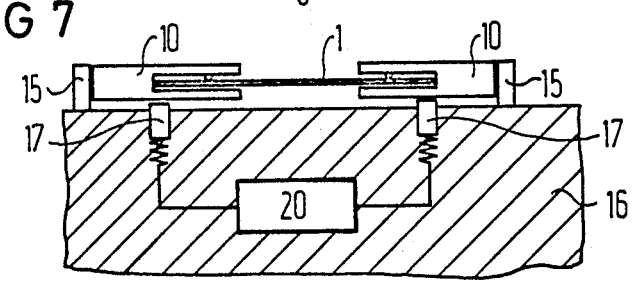
FIG. 7 is a fragmentary cross-sectional view, partly in elevation, of a sensor arranged on a substrate holder.

FIG. 7 shows an arrangement of the sensor composed of the reference substrate 1 and of the laminae 6, 10 on the substrate holder 16. The sensor is constructed in a way that the arrangement of the sensor on the substrate holder 16 can be accommodated in a coating chamber, for example, with the assistance of a robot. For that purpose, the substrate holder 16 comprises contact elements 17 such as contact pins which are resiliently urged in the substrate holder 16. The sensor is placed on the substrate holder 16 such that the measuring laminae 10 are in contact with the contact element 17. A separate fastening of the sensor to the substrate holder 16 is not necessary but it can be provided. This is indicated in FIG. 7 by support mounts 15. The contact elements 17 are connected to a measuring arrangement 20 that can be constructed according to the measuring arrangement of the above cited U.S. Pat. No. 4,543,576. The measuring arrangement 20 can lie in the substrate holder 16 or under the substrate holder 16 whereby the position of the measuring arrangement 20 relative to the substrate holder is such that it lies at the coolest location of the substrate holder 16.

The contact elements 17 are resiliently biased in the substrate holder 16. The spring power is such that the contact elements 17 are pressed against the measuring laminae 10 and, when a normal substrate is seated thereon, are pressed by the substrate into the substrate holder 16 in order to provide a uniform seating of the normal substrate on the substrate holder 16. The region of the substrate holder 16 in which the contact elements 17 lie can thus be used for accepting normal substrates even when they are not employed for measuring purposes.

When the sensor has been arranged on the substrate holder 16 in the coating chamber, coating can begin. Regions of the reference substrate 1 between the interconnects 2 and the laminae 6, 10 are thereby coated. An electrical connection between the interconnects 2 is thus produced. By measuring the potential at the contact regions 3 of the interconnects or by measuring the current flowing through the layer forming between the interconnects 2, for example, the resistance of the layer between the interconnects 2 can be calculated. When a thermocouple is arranged between the interconnects 2, the temperature in the reference substrate can be determined. Further, a measure of the plasma current is also possible with the assistance of measured values taken at the contact regions 3.

The sensor can also be used when a layer present from the very beginning on the reference substrate between the interconnects 2 is slowly eroded on the basis of a etching process.

In the coating process that occurs from above in FIG. 7, it is not only the reference substrate 1 that is coated but the laminae 10, 6 secured to the reference substrate are also coated. It is then advantageous that the carrier laminae comprise the projection 14 at the plate which faces away from the substrate holder 16. A spacing between the plate and the reference substrate 1 thus occurs in this region, this spacing preventing undesired contact bridges by means of the carrier laminae 6 from arising during the coating.

Other advantages of the invention occur in the sensor composed of the reference substrate 1 and the laminae 10, 6, has only a small height of, for example, 1.5 mm. The sensor is made such that it can be placed directly onto the substrate holder 16. The result is that the measuring arrangement can be arranged at the substrate holder 16 at the coolest location thereof.

It will be evident that various modifications can be made to the described embodiments without departing from the scope of the present invention.

I claim as my invention:

1. A sensor for measuring electrical properties of a coating on a reference substrate, comprising:

a substrate holder for supporting said reference substrate;

at least two electrical interconnects on said reference substrate;

carrier laminae supported on said reference substrate;

measuring laminae supported on said reference substrate for contact with said interconnects, the measuring laminae which do not contact the same interconnect having no contact with each other, and the measuring laminae including two spaced plates and a spacer located between said plates, one of said plate including an inwardly facing projection positioned to abut said reference substrate when said reference substrate and said measuring laminae are in assembled relation; and contact elements extending from said substrate holder and engaging said measuring laminae, the measuring laminae being free of contact to said substrate holder other than in the region of said contact elements.

2. A sensor according to claim 1 which includes a measuring device connected to said contact elements and located in said substrate holder.

3. A sensor according to claim 1, wherein said carrier laminae include two spaced plates, a spacer disposed between said plates, and an inwardly extending projection on one of said plates arranged to abut said reference substrate when said carrier laminae and said reference substrate are in assembled relation.

4. A sensor according to claim 3, wherein the plate of said carrier ceramic laminae which faces the substrate holder is thicker than the corresponding plate of the measuring laminae.

5. A sensor according to claim 1 wherein includes resilient means biasing said contact elements toward said measuring laminae.

6. A sensor for measuring electrical properties of a coating on a reference substrate, comprising:

a substrate holder for supporting said reference substrate;

at least two electrical interconnects on said reference substrate;

carrier laminae supported on said reference substrate;

said carrier laminae including two spaced plate and a spacer disposed between said plates, a spacer disposed between said plates, and an inwardly extending projection on one of said plates arranged to abut said reference substrate when said carrier laminae and said reference substrate are in assembled relation;

measuring laminae supported on said reference substrate for contact with said interconnects, the measuring laminae which do not contact the same interconnect having no contact with each other; and contact elements extending from said substrate holder and engaging said measuring laminae, the measuring laminae being free of contact to said substrate holder other than in the region of said contact elements.

7. A sensor according to claim 6, wherein the plate of said carrier laminae which faces the substrate holder is thicker than the corresponding plate of the measuring laminae.

8. A sensor according to claim 6, which includes resilient means biasing said contact elements toward said measuring laminae.

* * * * *